United States Patent [19]
Coene

[11] Patent Number: 5,432,347
[45] Date of Patent: Jul. 11, 1995

[54] METHOD FOR IMAGE RECONSTRUCTION IN A HIGH-RESOLUTION ELECTRON MICROSCOPE, AND ELECTRON MICROSCOPE SUITABLE FOR USE OF SUCH A METHOD

[75] Inventor: Willem M. J. M. Coene, Eindhoven, Netherlands

[73] Assignee: U.S. Philips Corporation, New York, N.Y.

[21] Appl. No.: 148,082

[22] Filed: Nov. 4, 1993

[30] Foreign Application Priority Data

Nov. 12, 1992 [EP] European Pat. Off. ............ 92203477

[51] Int. Cl.⁶ ............................................. H01J 37/26
[52] U.S. Cl. ................................... 250/307; 250/311
[58] Field of Search ........................ 250/306, 307, 311

[56] References Cited

U.S. PATENT DOCUMENTS

| | | | |
|---|---|---|---|
| 4,935,625 | 6/1990 | Hasegawa et al. | 250/306 |
| 4,998,788 | 3/1991 | Osakabe et al. | 250/306 |
| 5,095,207 | 3/1992 | Tong | 250/307 |
| 5,134,288 | 7/1992 | Van Dijck | 250/307 |
| 5,233,192 | 8/1993 | DeJong et al. | 250/307 |

OTHER PUBLICATIONS

H. Lichte, Electron holography imnproves the wave-optical facilities in electron microscopy, Electron Optics Bulletin field Emission TEM, Philips, pp. 29–35, Jun. 1991.

H. Lichte, Electron image Plne Off-axis Holography of Atomic Structures, Advances in Optical and Electron Microscopy vol. 12, 26–91, 1991.

*Primary Examiner*—Bruce C. Anderson
*Attorney, Agent, or Firm*—Leroy Eason

[57] ABSTRACT

A method for image reconstruction in a high-resolution electron microscope. The Fourier transform (29) of an electron hologram (28) is obtained which is composed of a central frequency domain $CB = I_{hol,0}(\overline{G})$ and two sidebands $SB+ = I_{hol,+}(\overline{G})$ and $SB- = I_{hol,-}(\overline{G})$. The two sidebands represent the linear image information. By making use of the frequencies in the central frequency domain in the image reconstruction, a non-linear image reconstruction is performed having a resolution which is considerably higher than the achievable information limit in linear image reconstruction using only the sidebands.

6 Claims, 3 Drawing Sheets

METHOD FOR IMAGE RECONSTRUCTION IN A HIGH-RESOLUTION ELECTRON MICROSCOPE, AND ELECTRON MICROSCOPE SUITABLE FOR USE OF SUCH A METHOD

BACKGROUND OF THE INVENTION

1. Field of the Invention

The invention relates to a method of reconstructing an object image in a high-resolution electron microscope, in which an electron wave function is obtained at an exit plane of the object from at least one electron hologram recorded in a Fourier space, which hologram is composed of a central frequency domain $CB = I_{hol,0}(\overline{G})$ and two sidebands $SB+ = I_{hol,+}(\overline{G})$ and $SB- = I_{hol,-}(\overline{G})$.

The invention also relates to a high-resolution electron microscope suitable for use of such a method.

2. Description of Related Art

Three factors by which the information to be obtained from the object is influenced can be distinguished in an electron microscope. These factors are: the interactions of the electrons with the object, the transmission of the information-carrying electron beam in the microscope and the recording of the image.

An electron wave in high-resolution electron microscopy is, in a good approximation, a monochromatic, coherent beam and can be represented as a uniform plane wave incident on an object and subsequently propagating through the object. The electron wave is then phase and amplitude-modulated in conformity with the structure of the object as a result of the interactions between the electron beam and the object. In the case of an ideal scattering, the electron state before and after scattering can be accurately determined and information about the interaction and hence information about the object can be obtained from the change of state. For very thin specimens (having a thickness of the order of 1–3 nm) mainly the phase will be modulated so that a phase object is concerned in this case. However, for thicker specimens them is not necessarily a simple relationship between the projected structure of the object and the electron wave function at the exit plane of the object, because non-linear effects occur during the diffraction process due to multiple scattering of the electrons on the atoms present in the object. This leads to electron beams whose amplitude is non-linearly dependent on the structure of the object.

Subsequently the electron wave provided with image information is propagated towards the detector via the electron-optical system of the electron microscope so that a high magnification is realised at the expense of aberrations such as spherical aberration and focusing effects. Due to these aberrations the phase of the electron wave at the level of the back-focal plane of the objective lens of the electron microscope will be distorted in known manner. These phase distortions are represented by what is known as the phase transfer function of the electron microscope.

Finally, the electron intensity is recorded at the detector, which intensity represents the probability distribution of the electron wave in the image plane. However, during this recording operation the phase information is lost, which information is essential for describing the interference process in the electron microscope.

After the image information has been recorded on a detector, the electron wave function at the exit plane of the object comprising the actual phase and amplitude information of the object can be reconstructed by means of image processing methods, while the effect of the aberrations of the electron microscope on the image information is eliminated. As compared with the conventional point resolution of the electron microscope, the resolution can be considerably enhanced in this way. Point resolution is understood to mean the smallest detail that can be distinguished after formation of the image in the microscope at optimum, or Scherzer, focus, and yields directly interpretable information about the object, but only if an object can be described as a thin phase object. The point resolution is mainly determined by the spherical aberrations of the objective lens and the wavelength of the electron beam.

Such image reconstructions can be performed by using different methods. A first method is known from U.S. Pat. No. 5,134,288. This Patent describes an image reconstruction method with reference to focal variations in conventional high-resolution electron microscopy. In this method a series of images of one and the same object portion is recorded at varying defocus values. A Fourier transform and a linear combination is performed on this series of images so that the linear and non-linear image information are separated from each other. Subsequently, specific image information can be selected by optimizing the linear image formation. Linear image information is to be understood to mean the part of the image contrast which, save for the transfer function of the electron microscope, is directly proportional to the wave function at the exit plane of the object.

A second method of image reconstruction is known from the article "Electron image plane off-axis holography of atomic structures" by Hannes Lichte in Advances in Optical and Electron Microscopy, vol. 12, 1991, pp. 25–91. This article describes a linear image reconstruction method using an electron hologram of the object portion to be reconstructed. An electron hologram is formed by interference of frequency components or beams of an electron wave comprising image information with a reference electron wave which directly originates from the electron source. The reference electron wave is only propagated through vacuum and is not modulated by the object, but it does have a spatial coherence with the electron wave comprising the image information. The interference pattern or electron hologram thus recorded is composed in the Fourier space, i.e. the spatial-frequency space or region, of a central frequency domain $I_{hol,0}(\overline{G})$ and two sidebands $I_{hol,+/-}(\overline{G})$ which are spatially separated from each other. This means that in this method the linear image information is directly separated from the non-linear image information. In fact, the sidebands only contain linear image information, in other words, information about the interferences between frequency components of the electron wave with image information and the undisturbed reference electron wave without image information. However, the central frequency domain is a combination of information about linear as well as non-linear interactions. Linear interactions in the central frequency domain are understood to mean interactions which take place between the on-going beam of the frequency $\overline{G}=0$ whose electrons are not scattered in the object, and one of the beams of the frequency $\overline{G}\neq0$ scattered in the object. Non-linear interactions are understood to mean interactions which take place between two beams of the frequencies $\overline{G}_1 \neq 0$ and $\overline{G}_2 \neq 0$ scattered in the object.

However, a drawback of this method is that the information limit of the high-resolution information which can be obtained from the sidebands of the hologram is limited by the temporal coherence of the source. Temporal coherence is related to the chromatic aberration of the objective lens, to instabilities in the high voltage and the lens currents and to thermal spread of energy of the electrons, which results in an effective focus fluctuation during recording. The information limit is herein understood to mean the smallest object detail which can be retrieved from the electron wave function when only linear interactions are taken into account, in other words, when considering only interferences between a beam with image information and the reference electron wave in electron holography, or between a beam with image information and the on-going beam in conventional high-resolution electron microscopy. This information limit is determined by the temporal coherence of the electron microscope.

Electron holography requires a high spatial coherence so as to realise an interference pattern which is sufficiently rich in contrast between the object wave and the reference wave. Such a high spatial coherence can be achieved, inter alia, by making use of a field emission gun (FEG).

It is known per se, inter alia from Philips Electron Optics Bulletin 130, pp. 53–62 (1991) by P. M. Mul, B. J. H. Bormans and M. T. Otten that the use of a field emission gun (FEG) may lead to a considerable improvement of the resolution due to the higher brightness and the better spread of energy in comparison with a conventional thermionic electron source such as, for example an $LaB_6$ filament. The supplementary high-resolution information which can be achieved with a FEG is, however, considerably influenced by the aforementioned electron-optical aberrations: spherical aberration and defocus, so that a direct interpretation of the experimental observations is impeded. The previously mentioned reconstruction methods, notably focus variation and standard electron holography do not provide a solution to this problem.

SUMMARY OF THE INVENTION

It is an object of the present invention to provide a method of reconstructing an object image in a high-resolution electron microscope and a suitable electron microscope for this method, yielding reliable and directly interpretable information about the object, with a resolution which is better than the conventional point resolution of the electron microscope and also better than the information limit which is achievable in linear image reconstruction by means of standard electron holography.

According to the invention, the method of reconstructing an object image is characterized in that in a first step of the method a linear image reconstruction is performed on the basis of the two sidebands of an electron hologram and in that the linear image reconstruction is the starting point for the non-linear image reconstruction on the basis of the central frequency domain of the electron hologram.

In the central frequency domain not only do linear interactions take place between beams with image information and the on-going beam, but also significant non-linear interactions take place between different frequency components of the beams with image information. These non-linear interactions are much less limited by temporal coherence. Consequently, the frequencies associated with the central domain represent information of a higher resolution than the information which is present in the sidebands. As a result, the use of information from the central frequency domain may lead to reliable, directly interpretable information up to a level beyond the currently defined information limit for linear image formation such as results from sideband off-axis holography.

In a first step an image reconstruction is obtained from the linear high-resolution information which is present in the frequencies of the sidebands. Subsequently, the result of this first step is the starting point for a second step of the method in which the linear high-resolution information is supplemented with the high-resolution information which is present in the central frequency domain.

An embodiment of the method of reconstructing an object image according to the invention is characterized in that the electron wave function is obtained from a series of electron holograms.

By making use of a series of electron holograms, for example n, in the image reconstruction, the signal-to-noise ratio can be considerably improved, for example by a factor of $\sqrt{n}$.

According to the invention an embodiment of the method of reconstructing an object image is characterized in that the series of electron holograms is constituted by holograms having different focus values.

It is possible to vary the focus setting for the different holograms of the series. As compared with a hologram series having a fixed focus setting, such a variation only yields supplementary information in the central frequency domain of the electron holograms, because the linear interactions in the sidebands can be corrected for the effects of focus variations. By varying the focus, the interactions in the central frequency domain are varied in a controlled manner.

According to the invention, a further embodiment of the method of reconstructing an object image is characterized in that the method is performed by iteration.

Since the additional information is spread in a relatively complicated way over the frequency space of the central frequency domain, the resolution may be further enhanced by reiterating the method.

According to the invention, a further embodiment of the method of reconstructing an object image is characterized in that an intensity measurement is performed on a diffraction pattern in the spatial-frequency region, which diffraction pattern originates from the same object portion as that from which the hologram has been recorded, the result of said measurement being subsequently added as additional amplitude information to the non-linear image reconstruction which results from the first and the second step of the method.

Such an intensity measurement on a diffraction pattern in the spatial-frequency region, which diffraction pattern originates from the same object portion as that from which the hologram has been recorded, yields additional amplitude information up to higher frequencies than can be derived from this electron hologram. By using this supplementary amplitude information it will be possible to obtain phase and amplitude information for higher frequencies than can be reconstructed by means of the central frequency domain, so that the resolution is enhanced.

According to the invention, a further embodiment of the method of reconstructing an object image is characterized in that a parameter analysis (alignment-focus (AF) analysis) is performed when using a series of holograms.

A considerable problem in high-resolution image reconstruction methods is the occurrence of focus drift between recordings. Moreover, specimen drift between recordings may occur when a hologram series is used so that alignment of the mutual positions of the recorded images is impeded. For this reason a parameter analysis is preferably performed so as to eliminate inaccuracies, caused by the above-mentioned instabilities, in the formation of the image.

The invention also provides an electron microscope comprising a field emission gun, an electron-optical system, a specimen mount, an electron-optical biprism, an electron detector and an image-processing system and is characterized in that the electron microscope is suitable for use of the method described hereinbefore.

BRIEF DESCRIPTION OF THE DRAWING

These and other aspects of the invention will be apparent from and elucidated with reference to the embodiments described hereinafter.

In the drawings

DESCRIPTION OF THE PREFERRED EMBODIMENTS

Figure 1:
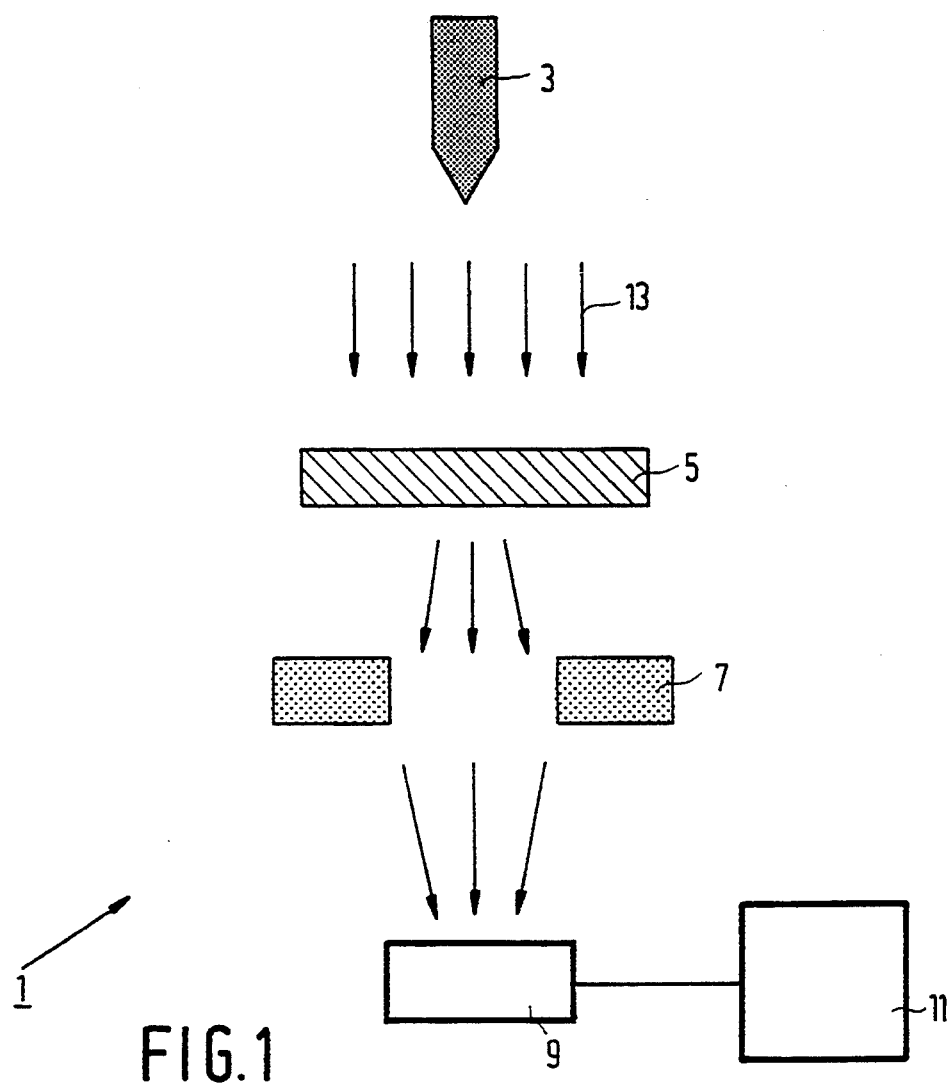
FIG. 1 is a diagrammatic representation of the image formation in an electron beam apparatus.

The electron microscope 1 shown diagrammatically in FIG. 1 comprises an electron source 3, an object 5, an electron-optical system 7 represented by a single objective lens for the sake of simplicity, an electron detector 9 and an image-processing system 11.

An electron beam 13 emitted by the electron source 3 and being incident on the object 5 will be amplitude and phase-modulated by interaction with this object and in conformity with the structure of the object. The electron beam 13 emitted by the electron source 3 may be represented by a plane wave. The electron wave, provided with object structure information, at the exit plane of the object can then be represented by $$\psi(\overline{R}) = a(\overline{R}).exp(i\phi(\overline{R}))$$

in which $a(\overline{R})$ represents the amplitude and $\phi(\overline{R})$ represents the phase of the electron wave disturbed by the object. $\psi(\overline{R})$ is converted by the lens action of the electron-optical system 7 into a wave $\Phi(\overline{G})$ in the back-focal plane of the objective lens. The waves $\psi(\overline{R})$ and $\Phi(\overline{G})$ are mathematically related to each other via a Fourier transform:

$$\Phi(\overline{G}) = FT[\psi(\overline{R})]$$

in which FT denotes Fourier transform. Subsequently the image wave $\Phi_d(\overline{G})$ is given by:

$$\Phi_d(\overline{G}) = \Phi(\overline{G})p(\overline{G})$$

in which $p(\overline{G})$ is the transfer function of the electron microscope in which the aberrations of the electron-optical system 7 are represented. Due to these aberrations the phase of $\Phi(\overline{G})$ will undergo an unwanted, but known disturbance. The electron wave $\Phi(\overline{G})$ in the back-focal plane of the objective lens indicates the spatial frequency distribution of the electron wave $\psi(\overline{R})$ at the exit plane of the object. The intensity distribution in the spatial-frequency region, as can be observed in the experimental diffraction pattern, gives a measure of the interferences between components of the electron wave, or of diffracted beams or of transmitted beams, at different spatial frequencies.

Figure 2:
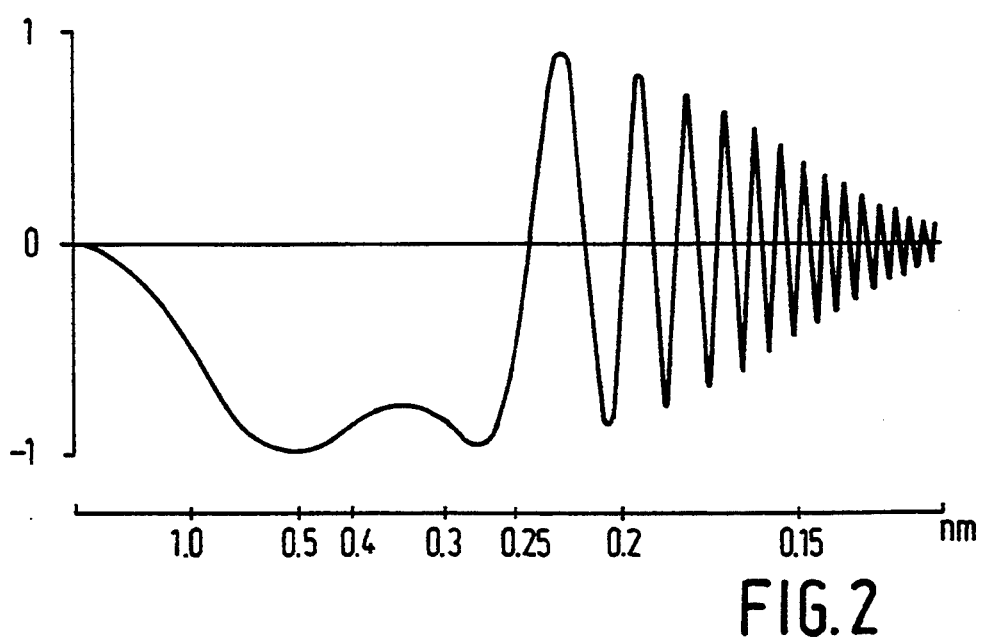
FIG. 2 shows the transfer function of an electron microscope having a field emission gun at Scherzer focus.

FIG. 2 shows an example of a transfer function of an electron microscope with damping due to the limited coherence. The Figure shows the achievable resolution plotted in nm on the horizontal axis. In this example the transfer function starts oscillating at 0.25 nm, which means that the information beyond this point resolution cannot be directly interpreted in a reliable manner from the high-resolution image.

The image intensity on the detector 9 is then obtained by squaring the image wave $\Phi_d(\overline{R})$ in the detector plane, which is the inverse Fourier transform of $\Phi(\overline{G})$, i.e.

$$I(\overline{R}) = |\Phi_d(\overline{R})|^2 = |FT^{-1}[\Phi(\overline{G})p(\overline{G})]|^2$$

This is an idealized manner of image formation. In practice the above-mentioned relation is averaged over the focal distribution profile for temporal coherence, as is described, inter alia by W. Coene in Proceedings of Electron Microscopy Society of America, Boston, USA, pp. 987–988.

The relation shows that the phase information is lost during recording on the detector, which information is essential for describing the interference process in the electron microscope. Image reconstruction methods envisage compensation of this loss of information. After the image information has been recorded on a detector, the electron wave function at the exit plane of the object is reconstructed, while correcting for the microscope aberrations. This wave function then comprises the actual phase and amplitude information about the object and is not disturbed by the microscope aberrations.

Such an image reconstruction can be performed in different manners, while the mode of recording the information which is used as a basis may be different. For this recording mode the present invention uses electron holography with which phase information is obtained directly.

Figure 3:
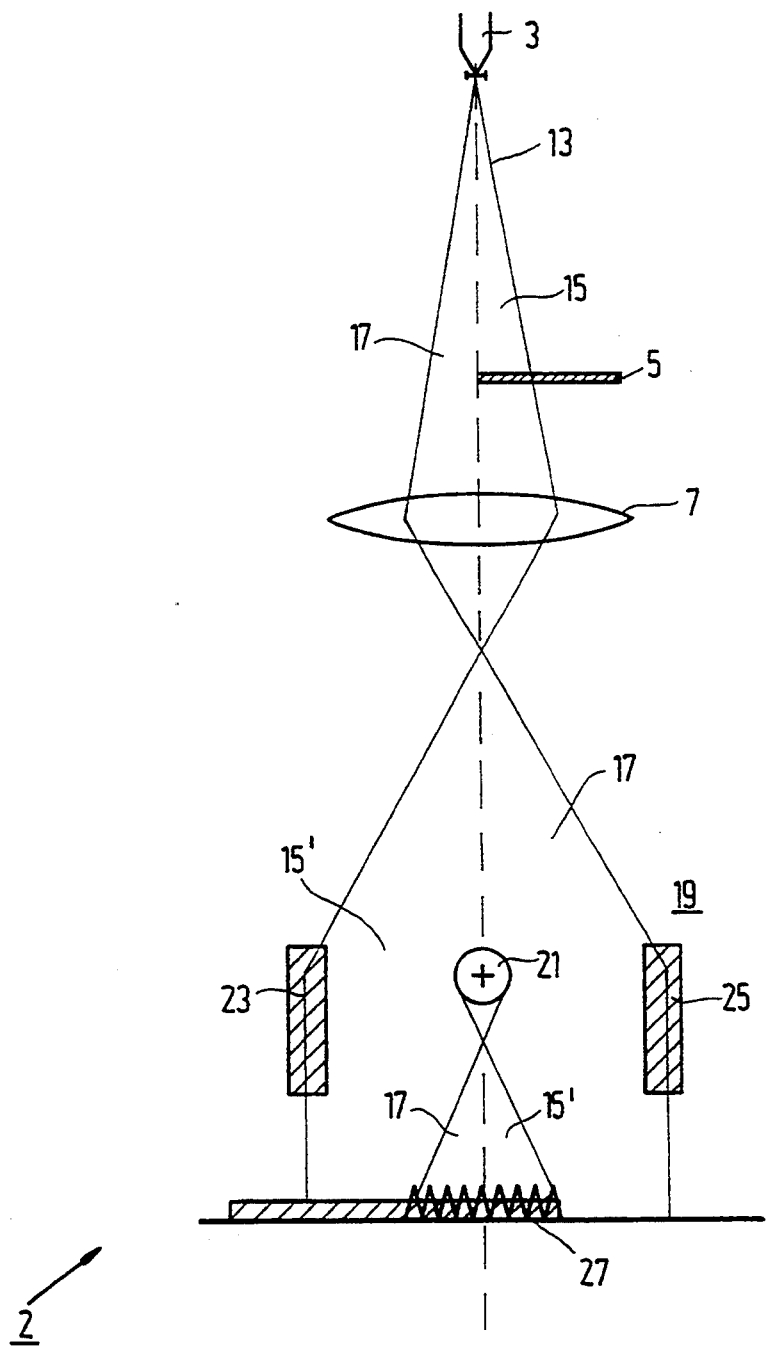
FIG. 3 shows diagrammatically an embodiment of an electron microscope according to the invention for recording electron holograms.

An electron hologram is formed by interference of an electron wave $\Phi_d(\overline{R})$ which comprises image information and a reference electron wave $\Phi_{ref}(\overline{R})$ which directly originates from the electron source. An example of an electron microscope 2 suitable for recording an electron hologram is shown in FIG. 3. The object to be examined is positioned in such a way that only a portion 15 of the electron beam 13 emitted by the electron source 3 impinges upon the object 5. The other portion 17 functions as a reference beam. The electron microscope 2 has a Möllenstedt biprism 19 comprising a filament 21 and two electrodes 23 and 25. The image wave $\Phi_d(\overline{R})$ 15' is present at one side of the filament 21 and the reference wave $\Phi_{ref}(\overline{R})$ 17 is present at the other side. By applying a positive voltage to the filament 21, the two waves 15' and 17' are deflected towards each other so that an interference pattern with an intensity distribution $I_{hol}(\overline{R})$ is generated in the area 27 where they overlap each other, which pattern yields an electron hologram upon recording. The intensity distribution across the hologram can be written as:

$$I_{hol}(\overline{R}) = |\Phi_d(\overline{R}) + \Phi_{ref}(\overline{R})|^2$$

in which $\overline{\Phi}$ represents the wave after deflection by the biprism. In practice the above-mentioned expression is averaged over the focal distribution profile for temporal coherence.

Figure 4:
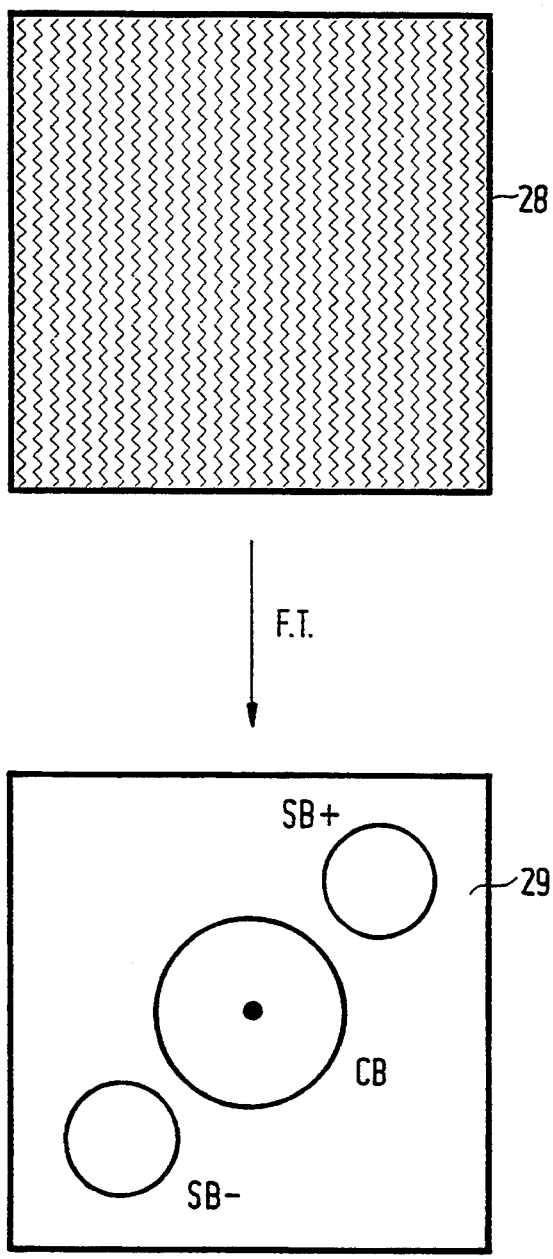
FIG. 4 shows diagrammatically an electron hologram.

Reconstruction of the image wave in amplitude as well as in phase is possible when starting from the Fourier transform of the image intensity of the electron hologram. FIG. 4 shows diagrammatically an electron hologram 28. By Fourier transformation F.T. of the image intensity $I_{hol}(\overline{R})$ of the hologram 28, an interference pattern 29 as shown in FIG. 4 is obtained in the Fourier space. In a simplified form, this interference pattern may be mathematically formulated as:

$$FT[I_{hol}(\overline{R})] = I_{hol,0}(\overline{G}) + I_{hol,+}(\overline{G}) + I_{hol,-}(\overline{G})$$

The interference pattern in the Fourier space, or spatial-frequency region, is composed of a central frequency domain $CB = I_{hol,0}(\overline{G})$ and two sidebands $SB+ = I_{hol,+}(\overline{G})$ and $SB- = I_{hol,-}(\overline{G})$. The two sidebands $SB+$ and $SB-$ represent the Fourier spectrum of the image wave and its complex conjugate. They comprise information about the interferences between beams with image information and the undisturbed reference wave, which is known as the linear image information: In image reconstruction methods based on the information from the sidebands the achievable information limit is limited by the temporal coherence of the source. Temporal coherence of the source is related to chromatic aberration, to instabilities in high voltage and the lens currents and to the energy spread of the electrons. Consequently, the focus will vary when a hologram is being recorded, which gives rise to a focal distribution profile around an average focus for this recording.

Electron holography requires a high spatial coherence so as to realise an interference pattern which is sufficiently rich in contrast between the object wave and the reference wave. Such a high spatial coherence may be achieved, inter alia by making use of a field emission gun (FEG) source.

It is known that the information limit can be improved by making use of such an electron source. In fact, a field emission gun has a higher brightness and thus better spatial coherence than a conventional thermionic electron source such as, for example, an $LaB_6$ filament. Due to the reduced energy spread of the FEG there will be less focal spread. The supplementary high-resolution information which is obtained by making use of a field emission gun is, however, affected by electron-optical aberrations such as spherical aberration and defocus which impede the interpretation of this supplementary information. It is possible to correct for these aberrations in the sidebands, so that temporal coherence remains the major limitation of the resolution which is achievable by means of the information in the sidebands.

In the present invention the information present in the central frequency domain CB is utilized for this purpose. The central frequency domain comprises information about interactions between electron beams with different image information.

A first step is based on the method by H. Lichte as described, for example in the article "Electron image plane off-axis holography of atomic structures" in "Advances in optical and electron microscopy", vol. 12, 1991, pp. 25-91, by performing a linear image reconstruction which is based on the linear image information of the sidebands. This reconstruction yields a wave function $\Phi_{SB}(\overline{G})$ which will be used as a starting point for the non-linear image reconstruction. The non-linear image reconstruction is based on a least-squares functional which leads to an electron wave $\Phi(\overline{G})$ representing the best fit in relation to the information contents of the hologram. This result can be achieved in different ways.

One way to achieve this will now be described briefly. In this description the image intensity in the "ordinary" high-resolution image, or the information in the central band of the hologram is represented in the frequency space by:

$$I(\overline{G}) = I_{CB}(\overline{G}) = \int d\overline{G}' \Phi(\overline{G} + \overline{G}') \Phi^*(\overline{G}') C(\overline{G} + \overline{G}', \overline{G}') \quad (1)$$

The functional C represents the transmission cross-coefficient which is a product of the phase transfer function $p(\overline{G})$ of the microscope for both frequency components $\overline{G}_1 = \overline{G} + \overline{G}'$ and $\overline{G}_2 = \overline{G}'$ with the respective envelope factors $E_t$ and $E_s$ due to temporal and spatial coherence:

$$C(\overline{G}_1, \overline{G}_2) = p(\overline{G}_1) p^*(\overline{G}_2) E_t(\overline{G}_1, \overline{G}_2) E_s(\overline{G}_1, \overline{G}_2) \quad (2)$$

The contribution in the sideband (for example, $SB-$) can be represented by:

$$I_{SB,-}(\overline{G}) = \Phi(\overline{G}) t(\overline{G}) \quad (3)$$

with t being the full transfer function for the sideband, given by $$t(\overline{G}) = p(\overline{G}) E_t(\overline{G}, 0) E_s(\overline{G}, 0) \quad (4)$$

In this expression $E_s$ is an adaptive form of the spatial coherence envelope in (2) which takes the interference between the object wave $\Phi$ and the reference wave $\Phi_{ref}$ into account. The reconstruction based on the sideband alone takes place by direct deconvolution using a Wiener filter. Such a mathematical filter prevents artificial amplification of the noise in the case where $|t(\overline{G})|$ is small. Consequently, the reconstructed wave function is given by:

$$\Phi_{rec}(\overline{G}) = \frac{t^*(\overline{G})}{|t(\overline{G})|^2 + N/S} I_{SB,-}(\overline{G}) \quad (5)$$

with N/S being the experimental signal-to-noise ratio.

The reconstruction by means of the central band minimizes the least-squares functional $$S^2 = \int d(\overline{G}) |\delta I_{hol}(\overline{G})|^2 \quad (6)$$

with the "hologram difference function" $\delta I_{hol}$:

$$\delta I_{hol} = \delta I_{CB} + \delta I_{SB,-} + \delta I_{SB,+} \quad (7)$$

and of the central band $$\delta I_{CB}(\overline{G}) = I_{CB,Exp}(\overline{G}) - I_{CB,\Phi}(\overline{G}) \qquad (8)$$

and analogous for $\delta I_{SB}$. In (8) $I_{CB,Exp}$ represents the intensity in the central band of the experimental hologram. $I_{CB,\Phi}$ is then the intensity in the central band of the computed hologram, which is computed on the basis of a particular choice of the object wave $\Phi$. Analogously, $I_{SB,Exp}$ and $I_{SB,\Phi}$ are introduced.

After minimization of (6) in relation to the object wave $\Phi(\overline{G})$ the following reconstruction scheme can be set up:

$$\Phi^{j+1}(\overline{G}) = \Phi^j(\overline{G}) + \gamma_{CB} \int d\overline{G}' C(\overline{G}',\overline{G}) \Phi^j(\overline{G}') \delta I_{CB}(\overline{G} - \overline{G}') + 2\gamma_{SB} t^*(\overline{G}) \delta I_{SB,-j}(\overline{G}) \qquad (9)$$

with $\gamma_{CB}$, $\gamma_{SB}$ representing the respective feedback factors for the central band and the sideband. The second term in the right-hand member of (9) comprises the central band information which is fed back to the object wave by means of a weighted correlation integral such as in (1). The third term in (9) comprises the sideband information for which a direct feedback takes place. The index j indicates the j-th iteration cycle. In the first step of the iteration procedure, notably for $j=0$, the solution is chosen from the sidebands:

$$\Phi^{j=0}(\overline{G}) = \Phi_{SB}(\overline{G})$$

by making use of relation (5).

$\Phi^{j=1}$ then yields the new object wave, using the central band information. Due to the equivalence between the two sidebands, equivalent relations such as (5) and (9) can be written for the sideband SB,+. The resolution may be further optimized by iteration until convergence is reached. In fact, the additional information is distributed over the central frequency domain in a relatively complicated manner.

This is the derivation for a single hologram. However, this relation can be generalized in a relatively simple manner for a series of holograms whose focus varies or does not vary. The reconstruction procedure can therefore be summarized as follows. $\Phi_{SB}(\overline{G})$ is determined from all N of holograms based on the sidebands. In the second step of the procedure the information in the central frequency domain of all of the N holograms is processed so that, in analogy with (9), the following formula can be written:

$$\Phi^{j+1}(\overline{G}) = \Phi^{j+1}[\Phi^j(\overline{G}), I^{exp}_{n,hol} - I^{\Phi j}_{n,hol}, n=1, \ldots, N]$$

with $\Phi^{j=0}(\overline{G})$ as the starting point, which is the solution resulting from the sidebands of the hologram series.

By making use of a hologram series without focus variation the signal-to-noise ratio is improved because the recorded information is integrated over a longer total period and hence with a higher total dose than in the case of a single hologram. By making use of a hologram series with focus variation, both supplementary information and an improved signal-to-noise ratio is obtained for the image reconstruction by means of the central frequency domain, while solely the signal-to-noise ratio is improved for the linear part in the sidebands. The central frequency domain of the hologram comprises the information which is present in a conventional high-resolution image. Thus, both linear and non-linear interferences between different frequency components of the object wave occur in the central frequency domain. Some of the non-linear interferences are achromatic and not limited or hardly limited by the temporal coherence of the microscope, which is in contrast to the linear interactions in the sidebands. In the case of linear interactions in the sidebands between electron beams with and without image information, the interference is maximally sensitive to focus variations, and the attenuation due to temporal coherence is strongly felt. The phase distortion is given by $$\exp(-i\pi\lambda\Delta f G^2)$$

in which $\Delta f$ is the defocus value and G is the spatial frequency in the Fourier space so that the phase distortion increases with an increasing frequency. The high spatial frequencies representing the ultra high-resolution information are thus highly focus-sensitive. When two electron waves with different spatial frequencies interfere, in other words, when there is non-linear interference, the resultant phase distortion is given by $$\exp(-i\pi\lambda\Delta f G_1^2 + i\pi\lambda\Delta f G_2^2) = \exp i\pi\lambda\Delta f(G_2^2 - G_1^2)$$

In the case of linear interactions when, for example, $G_1 = 0$, only one frequency $G_2$ is focus-sensitive. In the case of non-linear interactions, when $G_1 \neq 0$ and $G_2 \neq 0$, the focus effect on $G_1$ and $G_2$ is combined so that both effects can compensate each other and the focus sensitivity of the interference is reduced considerably. If $G_1 \approx G_2$, the two electron beams will be subject to the same focus fluctuation and there will be hardly any damping when the focal profile due to temporal coherence is averaged out. The central frequency domain thus comprises frequencies which may interfere without any damping occurring. These interferences are known as achromatic interferences. However, in the case of linear interactions such a compensation is excluded and there is a strong damping which increases with an increasing frequency. Consequently, directly interpretable information extending beyond the information limit for linear image formation can be obtained by making use of the information from the central frequency domain and by thus benefiting from achromatic non-linear interferences with ultra high-resolution information contents.

To ensure that the mutual position alignment of the images ($\delta e$, ovs $R_n$) and the mutual focus drift of the images between the recordings ($\delta f_n$) and in the combination of the information from a hologram series become less important, an AF analysis (alignment-focus) can be performed. This analysis is preferably performed during the linear image reconstruction step, but it may alternatively be performed during the non-linear image reconstruction step.

As already noted, the intensity distribution in the spatial-frequency region provides information about the interferences between components of the electron wave with different spatial frequencies. When an image reconstruction has been realised with one or more holograms having a given resolution, additional amplitude information can be obtained by performing an intensity measurement on a plurality of beams in the frequency region corresponding to spatial frequencies beyond this resolution, which is referred to as Selected Area Diffraction Pattern, and this additional amplitude information renders a better resolution achievable when it is added to the object wave reconstructed from the hologram in accordance with the first and the second step of the reconstruction method.

I claim:

1. A method for use in a high resolution electron microscope for reconstructing an electron wave image of an object, comprising:
   (i) forming an electron hologram of said object at an exit plane thereof and which is recorded in a Fourier spatial frequency space, said hologram having a central frequency domain and two sidebands, the sidebands comprising high resolution linear information relating to said electron wave image and the central frequency domain comprising high resolution non-linear information relating to said electron wave image;
   (ii) performing a reconstruction of said electron wave image from the linear information present in said sidebands; and
   (iii) supplementing the reconstruction performed in step (ii) with a reconstruction of said electron wave image from the non-linear information present in said central frequency domain.

2. A method as claimed in claim 1, wherein step (i) is repeated for each of a series of electron holograms of said object, and the image reconstruction performed in each of steps (ii) and (iii) utilizes information present in the central frequency domains and subbands of all of said holograms.

3. A method as claimed in claim 2, characterized in that the series of electron holograms is constituted by holograms having different focus values.

4. A method as claimed in claim 2, characterized in that an parameter analysis (alignment-focus (AF) analysis) is performed when using a series of holograms.

5. A method as claimed in claim 1, characterized in that an intensity measurement is performed on a diffraction pattern in the spatial-frequency space, which diffraction pattern originates from the same object portion as that from which the hologram has been recorded, the result of said measurement being subsequently added as additional amplitude information to the non-linear image reconstruction which results from step (iii) of the method.

6. An electron microscope comprising:
   a field emission gun for emitting electrons;
   an electron-optical system for forming the emitted electrons into an electron beam;
   a specimen holder for supporting a specimen partially in the path of the electron beam so as to form at an exit plane of the specimen a reference electron wave and an image electron wave which includes image information of the specimen;
   an electron-optical bypass for forming an interference pattern from the reference electron wave and the image electron wave;
   an electron detector for receiving the interference pattern and forming electrical signals representative thereof; and
   image processing means for receiving the electrical signals from the electron detector and
   (i) forming from said signals an electron hologram recorded in a Fourier spatial frequency space, said hologram having a central frequency domain and two sidebands;
   (ii) deriving a linear image reconstruction from the two sidebands, and
   (iii) using the central frequency domain to supplement the linear image reconstruction with a non-linear image reconstruction.

* * * * *